United States Patent [19]

Okudaira et al.

[11] 4,436,581
[45] Mar. 13, 1984

[54] UNIFORM ETCHING OF SILICON (DOPED AND UNDOPED) UTILIZING IONS

[75] Inventors: Sadayuki Okudaira; Hiroji Saida, both of Kokubunji; Yoshio Sakai, Hachioji; Shigeru Nishimatsu, Kokubunji; Keizo Suzuki, Hachioji, all of Japan

[73] Assignee: Hitachi, Ltd., Tokyo, Japan

[21] Appl. No.: 370,147

[22] Filed: Apr. 20, 1982

[30] Foreign Application Priority Data

Apr. 22, 1981 [JP] Japan ................................ 56-59852

[51] Int. Cl.³ .......................................... H01L 21/308
[52] U.S. Cl. .................................... 156/643; 156/646; 156/657; 156/662; 204/192 E
[58] Field of Search ............... 156/643, 646, 657, 662; 204/192 E

[56] References Cited

U.S. PATENT DOCUMENTS

| | | | |
|---|---|---|---|
| 4,123,316 | 10/1978 | Tsuchimoto | 156/643 |
| 4,183,780 | 1/1980 | McKenna et al. | 156/643 |
| 4,259,145 | 3/1981 | Harper | 156/643 |
| 4,277,304 | 7/1981 | Horiike | 156/643 |
| 4,298,419 | 11/1981 | Suzuki et al. | 156/643 |

FOREIGN PATENT DOCUMENTS 55-59723  5/1980  Japan .................................. 156/643

OTHER PUBLICATIONS

Heath, "Selective . . . Si", J. of Electrochemical Society, vol. 129, No. 2, (2/82), pp. 396–402.
Coburn et al., "Ion-. . . etching", J. of Applied Physics, vol. 48, No. 8, (8/77), pp. 3532–3540.
Irene et al., "An Electron . . . Silicon", J. of Electrochemical Soc., vol. 128, No. 3, pp. 1971–1974.
Schwartz et al., "Reactive . . . Silicon", J. of Vacuum Science Tech., vol. 16, No. 2, (4/79), pp. 410–413.
Suzuki et al., "The Roles . . . Etching", J. of Electrochemical Soc., vol. 126, (6/79), pp. 1024–1028.

Primary Examiner—Jerome W. Massie
Attorney, Agent, or Firm—Antonelli, Terry & Wands

[57] ABSTRACT

A plurality of silicon regions different in impurity concentration from each other are simultaneously subjected to dry etching in such a manner that neutral particles in a plasma do not substantially participate in etching and therefore etching is performed substantially by ions. Thus, the silicon regions different in impurity concentration from each other can be etched at substantially the same etching rate, independently of impurity concentration.

11 Claims, 14 Drawing Figures

FIG. 8
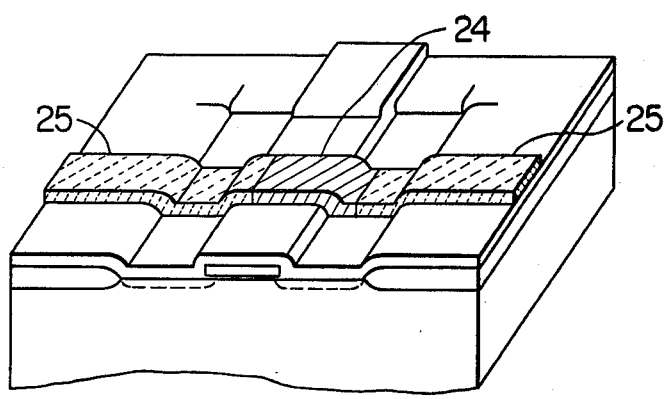
FIG. 9a
FIG. 9b
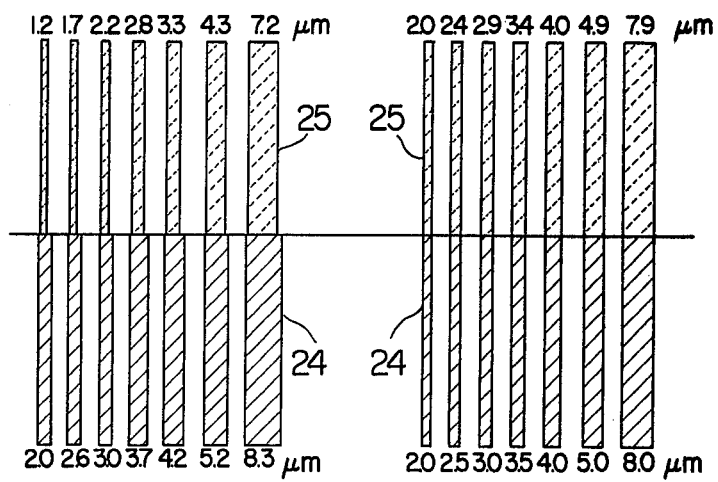

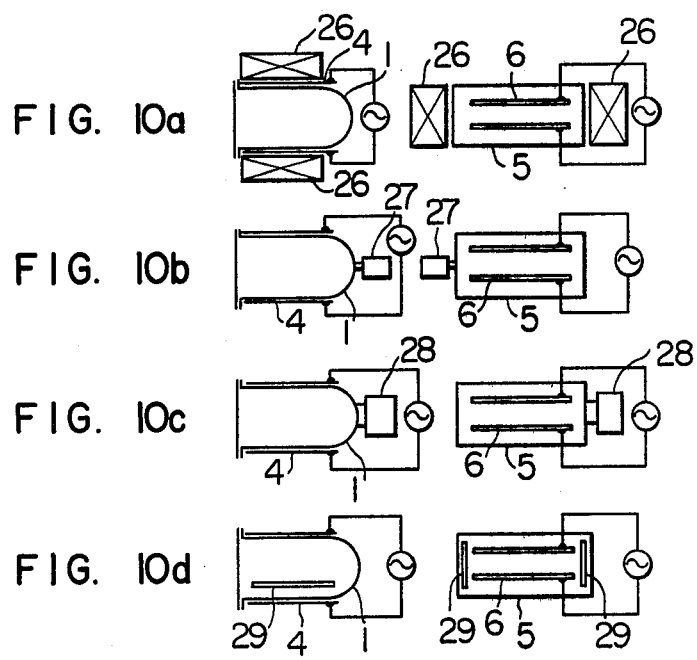

UNIFORM ETCHING OF SILICON (DOPED AND UNDOPED) UTILIZING IONS

BACKGROUND OF THE INVENTION

1. Field of the Invention

The present invention relates to a dry etching method, and more particularly to a dry etching method for simultaneously etching a plurality of silicon regions different in impurity concentration from each other.

2. Description of the Prior Art

When a monocrystalline or polycrystalline silicon wafer is etched by a conventional dry etching method such as plasma etching or reactive ion etching, there arises a problem that the etching rate and the shape or dimensions of a pattern formed by the etching are different in regions of the silicon wafer having different characteristics. That is, the etching rate for the silicon wafer varies with impurity concentration thereof. In the case where, after an impurity such as phosphorous, boron, or arsenic has been diffused in or implanted through the ion implantation technique in a desired portion of a monocrystalline silicon substrate or a polycrystalline silicon film, the silicon substrate or silicon film is subjected to dry etching to fabricate a semiconductor device, the etching rate is different in a plurality of regions of the silicon substrate (or silicon film) which have different impurity concentrations.

Accordingly, in the case where a plurality of regions in a silicon wafer which are different in impurity concentration from each other, must be etched simultaneously, it has been difficult to etch these regions to the same depth at the same period of time, and the etching depth (namely, the degree of etching) differs in regions.

Further, according to the usual plasma etching method, after the etching in the direction of depth has been completed, side etching proceeds, and thus the width of a pattern formed by etching becomes small. Accordingly, in the case where impurity concentration is different in regions of a silicon wafer, patterns formed in these regions are different from each other in dimensional accuracy.

SUMMARY OF THE INVENTION

An object of the present invention is to provide a dry etching method which can solve the above-mentioned problems in the conventional dry etching methods, and which can etch a plurality of silicon regions having different impurity concentrations at substantially the same etching rate and can form a desired pattern in these regions with the same dimensional accuracy.

BRIEF DESCRIPTION OF THE DRAWINGS

FIG. 8 is a perspective view showing a portion of an LSI memory.

FIGS. 9a and 9b show dimensions of a bar pattern, each bar including silicon regions of different impurity concentrations obtained through a conventional dry etching method, and dimensions of a bar pattern each bar including silicon regions of different impurity concentration obtained through a dry etching method according to an embodiment of the present invention, respectively, to compare the results of the conventional dry etching methods and the method according to the present invention.

FIGS. 10a to 10d show structures of various etching apparatuses usable in the present invention.

DESCRIPTION OF THE PREFERRED EMBODIMENT

Prior to explanation of the present invention, the conventional dry etching technique will be explained.

Figure 1:
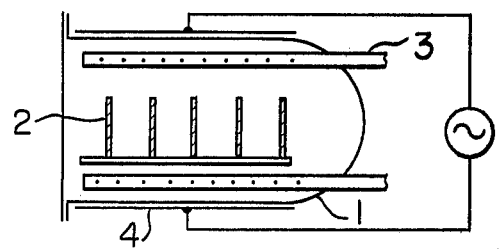
FIGS. 1 and 2 show a structure of a conventional barrel type plasma etching apparatus and a structure of a conventional reactive sputter etching apparatus, respectively.

FIG. 1 shows a conventional barrel type plasma etching apparatus used in the fabrication of semiconductor devices and in other fields. Referring to FIG. 1, silicon wafers 2 to be etched are placed in a reaction vessel 1 made of quartz glass, and then a high-frequency power is applied to electrodes 4 which are provided outside the reaction vessel 1. A reactive gas is introduced into the reaction vessel 1 through a gas supply pipe 3, to generate in the reaction vessel 1 a plasma for etching the silicon wafers 2.

Figure 2:
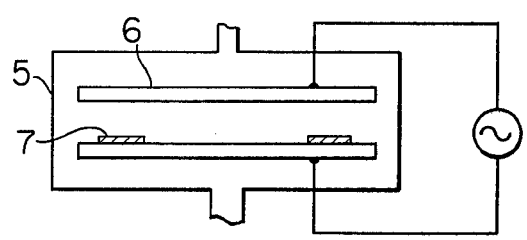

FIG. 2 shows a conventional parallel plate type reactive sputter etching apparatus (which is also called a reactive ion etching apparatus). Referring to FIG. 2, silicon wafers 7 to be etched are placed on one of parallel plate electrodes 6 which are disposed face to face with each other in a reaction vessel 5. A reactive gas is introduced into the reaction tube 5 and then a high-frequency power is applied to the electrodes 6 to etch the silicon wafers 7.

In the conventional etching methods using the apparatuses shown in FIGS. 1 and 2, etching rate is different in regions having different impurity concentrations, as mentioned previously. In general, etching rate is large as impurity concentration is higher. This can be considered as that a large part of dry etching is performed also through a chemical reaction and a difference in etching rate between regions having different impurity concentration is ascribed to a difference between rates of chemical reaction in these regions. When etching rate differs in regions having different impurity concentrations, there arise the following two problems.

Figure 3:
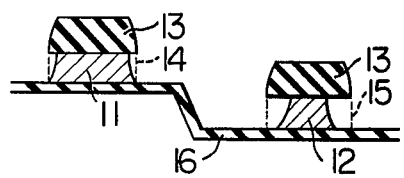
FIGS. 3 and 4 are views for explaining various states of etched regions in the case where etching has been carried out in the etching apparatuses shown in FIGS. 1 and 2.

(1) As exemplified in FIG. 3, in the case where a lightly-doped polycrystalline silicon film 11 and a highly-doped polycrystalline silicon film 12 are provided on an underlying film 16, the films 11 and 12 are subjected to side etching at their portions situated beneath resist masks 13 and the width of side etching 14 in the film 11 differs from the width of side etching 15 in the film 12. This is because, after etching for the films 11 and 12 has been completed, over etching is made, that is, the portions of the films 11 and 12 situated beneath the masks 13 are etched in lateral directions, and the time assigned to the side etching in the lateral directions differs in the films 11 and 12.

In more detail, as mentioned above, etching rate in the film 12 having a higher impurity concentration is larger than that in the film 11, and therefore the etching in the vertical or depthwise direction for the film 12 terminates earlier than that for the film 11 does. Accordingly, the time assigned to etching in the lateral direction is longer in the film 12 than in the film 11, that is, the width of side etching in the film 12 is larger than that in the film 11, and therefore the dimensions of a left-behind pattern formed in the film 12 are small as compared with the dimensions of a corresponding pattern formed in the film 11.

Figure 4:
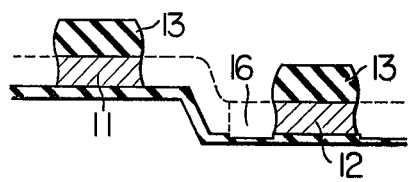

(2) Even when an etching method which causes substantially no side etching is used, an exposed portion of the highly-doped film 12 is etched off earlier than an exposed portion of the low-doped film 11, since etching rate for the film 12 is larger than that for the film 11. As a result, the thickness of the underlying film 16 (made of $SiO_2$, $Si_3N_4$, or the like) differs in portions, as shown in FIG. 4.

Figure 5:
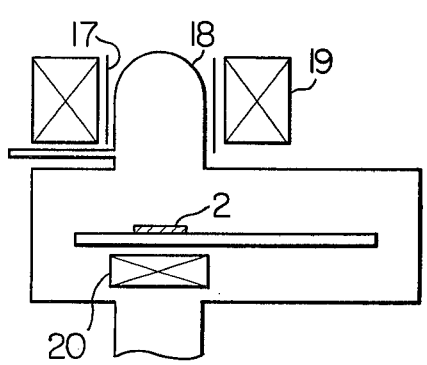
FIG. 5 is a view for explaining a magneto-microwave plasma etching apparatus usable in the present invention.

Now, an embodiment of the present invention will be explained. FIG. 5 is a schematic view showing a magneto-microwave plasma etching apparatus for performing etching by a plasma generated by microwaves (e.g. 2.45 GHz). The apparatus shown in FIG. 5 was proposed by persons including one of the present inventors, (see U.S. Pat. No. 4,101,411 corresponding to Japanese Patent Application (Laid-open No. 71597/1976)).

Referring to FIG. 5, microwaves generated by a magnetron (not shown) are introduced through a waveguide 17 into a quartz tube 18 to generate therein a plasma, which impinges on a silicon wafer 2 to be etched, through the aid of a micron-type magnetic field established between a solenoid 19 and a magnet 20 to effect quenching. Here, microwave is more easily absorbed by the plasma gas than radio wave and hence is advantageous to establish a high density plasma.

A feature of this apparatus lies in ability of producing a high-density plasma even at a low gas pressure. In more detail, in this apparatus, a plasma can be generated at a low gas pressure, e.g. of the order of $10^{-4}$ Torr which is two or three orders of magnitude lower than the pressure used in the conventional etching apparatuses. At such low pressures, the number of neutral particles contributing to etching is very small.

On the other hand, the number of ions contained in the plasma is very large since the plasma is high in density. Accordingly, etching is, for the most part, performed by ions, and sputter etching is scarcely performed. In other words, etching is carried out mainly through the chemical reaction of ions.

Figure 6:
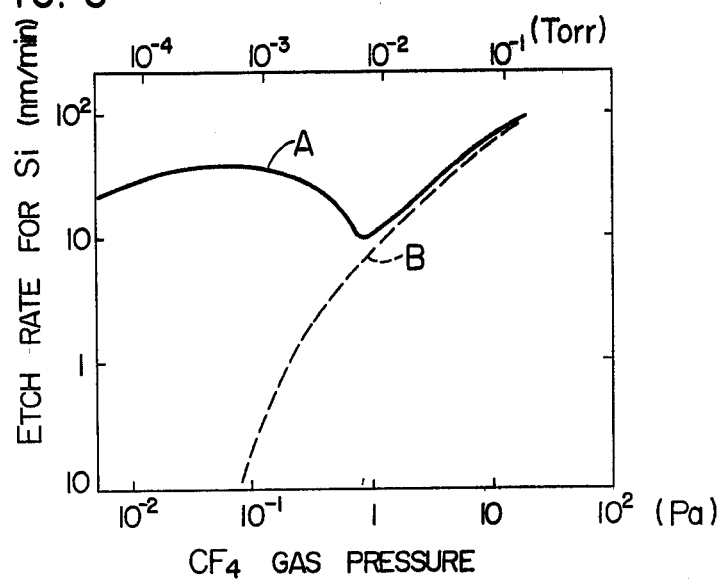
FIG. 6 is a graph showing relations between pressure of reactive gas and etching rate.

FIG. 6 shows relations between pressure of $CF_4$ gas and etching rate which were obtained when silicon wafers were etched by a $CF_4$ gas plasma.

In FIG. 6, a curve A shows the case where the plasma generated in the quartz tube 18 was directly impinged on the silicon wafer 2, and a curve B shows the case where screen grids for shielding both ions and electrons were provided in the quartz tube 18 between the plasma and the silicon wafer 2. Accordingly, the curve B shows an etching characteristic at the time when the silicon wafer 2 was etched only by neutral particles.

As is apparent from FIG. 6, in the case where the pressure of $CF_4$ gas is very high, the curves A and B substantially coincide with each other, and therefore etching is performed only by neutral particles. On the contrary, in the case where the pressure of $CF_4$ gas is low, etching is performed substantially by ions.

As can be seen in FIG. 6, the etching by neutral particles (curve B) rapidly decreases with the decrease of the gas pressure, while the total etching rate (curve A) keeps a relatively high value over the shown gas pressure range.

Provided that the practical etching rate is of the order of 10 nm/min. or more, the contribution of neutral particles to etching can be substantially neglected at gas pressures not higher than about $3 \times 10^{-3}$ Torr, at which pressure the ratio of etching rate by ions to that of neutral particles is about 10:1.

In the case of fabricating a very fine pattern (e.g. 1 $\mu$m rule pattern), a very high uniformity of etching (e.g. $\pm 0.1$ $\mu$m or less) may be required. For providing a better uniformity of etching in such a case, it is further preferred to select a gas pressure not higher than about $2 \times 10^{-3}$ Torr, at which pressure the ratio of etching rate by ions to that of neutral particles is about 30:1.

Similar results were obtained also for other freon gases such as $C_2F_6$, $C_3F_8$, $C_4F_{10}$, etc. and the gas pressures of $3 \times 10^{-3}$ Torr and $2 \times 10^{-3}$ Torr are found to have similar technical meanings.

When $SF_6$ was used in place of $CF_4$, like tendency as shown in FIG. 6 in a $CF_4$ gas pressure range not higher than about $2 \times 10^{-3}$ Torr was obtained in a $SF_6$ gas pressure range not higher than about $8 \times 10^{-4}$ Torr, at which pressure the ratio of etching rate by ions to that by neutral particles was found to be about 30:1.

When silicon wafers different in impurity concentration from each other are etched at such a low pressure of gas, that is, under the condition that the contribution of neutral particles to etching can be substantially neglected, etching rate is substantially independent of impurity concentration, and therefore it is possible to etch the silicon wafers equally.

Figure 7:
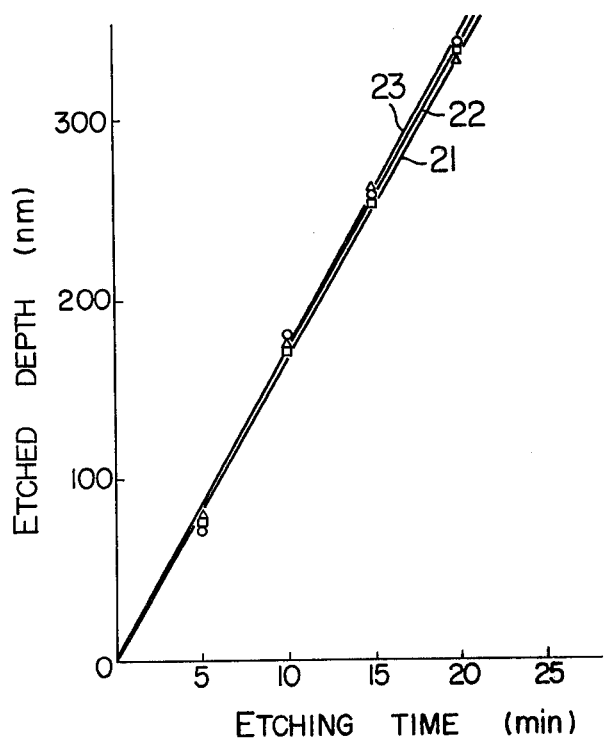
FIG. 7 is a graph showing relations between etching time and etching depth in the case where silicon regions different in impurity concentration from each other are etched in accordance with the present invention.

In FIG. 7, lines 21, 22 and 23 show relations between etching time and etching depth for an undoped monocrystalline silicon wafer, an undoped polycrystalline silicon wafer and a polycrystalline silicon wafer doped with phosphorous at a concentration of $10^{20}$ cm$^{-3}$, respectively, in the case where these wafers were etched in an apparatus as shown in FIG. 5, under the condition that the apparatus was filled with $CF_4$ at a pressure of $1 \times 10^{-3}$ Torr. As is apparent from the lines 21, 22 and 23, when silicon wafers are etched under the condition that the contribution of neutral particles to etching is substantially neglected and therefore etching is performed only by ions, these wafers are etched at the same rate independently of impurity concentration.

This fact will be explained in more detail, with reference to FIG. 8. FIG. 8 shows a portion of a memory included in an LSI device. Referring to FIG. 8, a polycrystalline silicon film which is a second layer, is made up of an undoped polycrystalline silicon film 24 and a polycrystalline silicon film 25 doped with phosphorous.

If the polycrystalline silicon film having such a structure and a thickness of about 3500 Å is formed by the conventional plasma etching using an apparatus as shown in FIG. 1 and a mixture gas of $CF_4$ and $O_2$, the width of the phosphorous-doped polycrystalline silicon film 25 becomes smaller than that of the undoped polycrystalline silicon film 24 by a value between about 0.9 $\mu$m and about 1.1 $\mu$m, as shown in FIG. 9a, and therefore it is impossible to obtain a polycrystalline silicon film which includes the films 24 and 25 of uniform width.

According to the present invention, however, the width of a phosphorous-doped polycrystalline silicon film 25 is only smaller than that of an undoped polycrystalline silicon film 24 by about 0.1 μm or less, as shown in FIG. 9b, and therefore a difference in width between the silicon films 24 and 25 can be neglected from a practical point of view.

Further, when a polycrystalline silicon film forming a second layer is obtained by an etching method in which neutral particles have substantially no connection with etching and therefore etching is performed only by ions, there is little fear of an underlying layer, which is made of $SiO_2$ or $Si_3N_4$, being etched, since the etching rate for the underlying layer is equal to or less than about one-fiftieth of the etching rate for the polycrystalline silicon film at a gas pressure of $1 \times 10^{-4}$ Torr.

This ratio (50:1) of etching for polycrystalline silicon to the $SiO_2$ or $Si_3N_4$ underlie becomes larger (to about 100:1) at higher gas pressures and becomes slightly smaller for lower gas pressures.

On the other hand, in the conventional plasma etching method or conventional reactive sputter etching method, the pressure of an etching gas is higher than in the present invention, that is, a pressure between about $10^{-2}$ Torr and about $10^{-1}$ Torr is generally used, and therefore the contribution of neutral particles to etching is great, as is apparent from FIG. 6.

Further, in the reactive sputter etching method, since ions will have an energy amounting to more than hundreds of electron volts, the effect of sputter etching is large. However, since etching by neutral particles is isotropical, a portion of the silicon film situated beneath a mask is etched by neutral particles, that is, the silicon film is subjected to marked side etching. Accordingly, it is difficult to accurately control the dimensions of various patterns such as a wiring pattern.

Moreover, when the energy of ions is high, difference in sputtering rate for different kinds of materials is not large. Accordingly, in the case where two or more kinds of films are exposed, it is impossible to selectively etch only a desired film by the high-energy ions.

The present invention is based upon a novel knowledge that a high-density plasma generated in a low-pressure gas can etch a plurality of regions of a monocrystalline or polycrystalline silicon wafer which are different in impurity concentration from each other, at substantially the same etching rate, and a pattern formed in the regions by this etching has substantially the same dimensions in these regions.

The above-mentioned magneto-microwave plasma etching apparatus is most suited to generate such a high-density plasma in a low-pressure gas. In the conventional barrel type plasma etching apparatus or conventional reactive sputter etching apparatus, when the pressure of gas is made low, the plasma density becomes low, and it becomes difficult to begin and/or maintain discharge. However, the plasma density in the conventional etching apparatuses which ranges usually at $10^{-5}$ to $10^{-6}$ for radio wave plasma can be made high by more than one order of magnitude, by adding a magnet coil, a radioactive source, and/or a laser emission source to these apparatuses. Then, a high-density plasma can be generated in a low-pressure gas, and it becomes possible to carry out etching in which contribution of neutral particles is small. FIG. 10a shows two structures: the left one including a magnet coil 26 added to the conventional barrel type plasma etching apparatus and the right one including a magnet coil 26 added to the conventional reactive sputter etching apparatus. In FIG. 10b, a radioactive source 27 is added to the above-mentioned respective etching apparatuses, and in FIG. 10C a laser emission source 28 is added to these etching apparatuses. Magnetic field serves to elongate the lifetime of electrons and hence to increase the ionization of gas molecules, while laser and radiation directly ionize the gas molecules.

The plasma density in an etching apparatus has a direct connection with a reaction caused only by ions, and therefore it is effective in increasing the rate of reaction to enhance the plasma density. However, it depends upon the kind and pressure of gas how far the plasma density is to be enhanced.

Further, it is effective to positively decrease the number of activated particles in addition to or in place of increasing the plasma density. FIG. 10d shows an example of such a structure. Referring to FIG. 10d, a material 29 reacting with the etching species is placed in a reaction vessel to decrease the number of neutral particles. In the case where a reactive gas in the reaction vessel is a gas containing fluorine as one of its main components, a material which reacts with fluorine to yield a non-volatile (low vapor pressure) compound, such as Cu, Ni, Nb, Li, is used. In the case where the reactive gas is a gas containing chlorine as one main component, a material which reacts with chlorine to yield a non-volatile compound, may be used.

As mentioned previously, when the pressure of a freon gas such as $CF_4$ in the reaction vessel is made lower than about $3 \times 10^{-3}$ Torr, or when the pressure of $SF_6$ in the reaction vessel is made lower than about $8 \times 10^{-4}$ Torr, it is possible to perform etching substantially by ions, without any substantial participation of neutral particles in etching.

However, when the pressure of a freon gas such as $CF_4$ is made lower than about $5 \times 10^{-5}$ Torr, various phenomena which are unfavorable to dry etching, becomes remarkable. That is, it becomes difficult to start and/or maintain discharge, the rate of reaction is decreased, the plasma temperature is raised, and so on. Therefore, it is undesirable to make the pressure of the freon gas lower than about $5 \times 10^{-5}$ Torr.

In the case where $SF_6$ is used in place of a freon gas, it is preferable for the same reasons as above to carry out etching at a pressure not lower than about $2 \times 10^{-5}$ Torr.

As can be seen from the above, a preferable pressure of a freon gas such as $CF_4$ in a reaction vessel lies in a range from about $5 \times 10^{-5}$ to about $3 \times 10^{-3}$ Torr, and more preferably between about $5 \times 10^{-5}$ and about $2 \times 10^{-3}$ Torr, and a preferable pressure of $SF_6$ in a reaction vessel lies in a range from about $2 \times 10^{-5}$ to about $8 \times 10^{-4}$ Torr.

As is evident from the foregoing explanation, according to the present invention, a plurality of silicon regions which are different in impurity concentration from each other, can be etched at substantially the same etching rate, and a pattern having substantially the same dimensions can be formed by these regions without being subjected to any significant side etching. Therefore, the present invention is very useful in fabricating semiconductor devices of various kinds.

We claim:

1. In a dry etching method for simultaneously etching a plurality of silicon regions different in impurity concentration from each other, by bringing said silicon regions into contact with a plasma, the improvement comprising a step of performing dry etching, in a magneto-microwave etching apparatus, for said silicon regions substantially only by ions contained in said plasma, whereby each of said plurality of silicon regions different in impurity concentration from each other is etched at substantially the same etching rate to provide etching to substantially the same depth.

2. A dry etching method according to claim 1, wherein said dry etching for said silicon regions is carried out while putting the pressure of freon acting as a reactive gas in a range from about $5 \times 10^{-5}$ to about $3 \times 10^{-3}$ Torr.

3. A dry etching method according to claim 1, wherein said dry etching for said silicon regions is carried out while putting the pressure of $SF_6$ acting as a reactive gas in a range from about $2 \times 10^{-5}$ to about $8 \times 10^{-4}$ Torr.

4. A dry etching method according to claim 2, wherein said freon is at least one selected from a group consisting of $CF_4$, $C_2F_6$, $C_3F_8$ and $C_4F_{10}$.

5. A dry etching method according to claim 1, wherein said plurality of silicon regions different in impurity concentration include a polycrystalline silicon region.

6. A dry etching method according to claim 1, wherein said plurality of silicon regions different in impurity concentration comprise a plurality of polycrystalline silicon regions.

7. A dry etching method according to claim 6, wherein said plurality of polycrystalline silicon regions include a non-doped region and a heavily doped region.

8. In a method of manufacturing a semiconductor LSI device including a memory element which comprises, on a silicon substrate, an underlying layer formed of one of silicon oxide and silicon nitride, and a polycrystalline silicon film including a non-doped area and a doped area, a method of etching comprising the steps of:
forming a polycrystalline silicon layer having non-doped regions and doped regions; and
selectively etching said polycrystalline silicon layer to form said polycrystalline film and leaving a line pattern, including said doped area and said non-doped area, of substantially equal width, the selective etching including forming a plasma of high density in a microwave electromagnetic field and a static magnetic field at a Freon gas pressure in a range from about $5 \times 10^{-5}$ to about $2 \times 10^{-3}$ Torr, whereby the non-doped regions and doped regions are etched at substantially the same etch rate to provide etching to substantially the same depth in the doped and non-doped regions and to provide doped and non-doped areas of substantially equal width.

9. A method according to claim 8, wherein said reactive gas comprises $CF_4$ and said doped area is doped with phosphorus.

10. In a dry etching method for simultaneously etching a plurality of silicon regions different in impurity concentration from each other, by bringing said silicon regions into contact with a plasma, the improvement comprising providing a plasma, for said dry etching of said plurality of silicon regions, with a sufficiently high density, generated in a sufficiently low-pressure gas, such that the dry etching is carried out substantially only by ions contained in said plasma, whereby each of said plurality of silicon regions different in impurity concentration from each other is etched at substantially the same etching rate to provide etching to substantially the same depth.

11. A dry etching method according to claim 10, wherein said dry etching for said silicon regions are carried out in one of a plasma etching apparatus and a reactive sputter etching apparatus, each of which is provided with one of means for generating a magnetic field, means for emitting a radioactive ray and means for emitting a laser ray, each of said means acting to increase the density of the plasma as compared to the density of the plasma formed without said one of the means.

* * * * *